(12) United States Patent
Shute

(10) Patent No.: US 9,231,624 B2
(45) Date of Patent: Jan. 5, 2016

(54) TIME ALIGNMENT FOR AN AMPLIFICATION STAGE

(75) Inventor: Nicholas Shute, Cambridgeshire (GB)

(73) Assignee: SNAPTRACK, INC., San Diego, CA (US)

(*) Notice: Subject to any disclaimer, the term of this patent is extended or adjusted under 35 U.S.C. 154(b) by 85 days.

(21) Appl. No.: 14/122,506

(22) PCT Filed: May 28, 2012

(86) PCT No.: PCT/EP2012/059935
§ 371 (c)(1),
(2), (4) Date: Feb. 25, 2014

(87) PCT Pub. No.: WO2012/163874
PCT Pub. Date: Dec. 6, 2012

(65) Prior Publication Data
US 2014/0179250 A1    Jun. 26, 2014

(30) Foreign Application Priority Data

May 27, 2011    (GB) .................................. 1108979.4

(51) Int. Cl.
| | |
|---|---|
| *H03C 1/62* | (2006.01) |
| *H04B 17/00* | (2015.01) |
| *H04B 1/04* | (2006.01) |
| *H03F 1/02* | (2006.01) |
| *H03F 1/32* | (2006.01) |

(Continued)

(52) U.S. Cl.
CPC ............ *H04B 1/0458* (2013.01); *H03F 1/0244* (2013.01); *H03F 1/3247* (2013.01); *H03F 3/24* (2013.01); *H04L 27/367* (2013.01); *H03F 2200/102* (2013.01); *H03F 2200/336* (2013.01); *H03F 2200/435* (2013.01); *H03F 2200/451* (2013.01); *H04B 2001/0408* (2013.01)

(58) Field of Classification Search
USPC ........ 455/102, 108, 110, 115.1, 115.2, 127.1, 455/127.2; 375/295; 332/145
See application file for complete search history.

(56) References Cited

U.S. PATENT DOCUMENTS

| | | |
|---|---|---|
| 2005/0079835 A1 | 4/2005 | Takabayashi et al. |
| 2006/0246856 A1* | 11/2006 | Udagawa et al. ............. 455/108 |
| 2008/0268799 A1 | 10/2008 | McCune et al. |

(Continued)

FOREIGN PATENT DOCUMENTS

WO    2007013034 A1    2/2007

OTHER PUBLICATIONS

"Related International Application No. PCT/EP2012/059935", "International Preliminary Report on Patentability", Dec. 12, 2013, Publisher: PCT, Published in: CH.

(Continued)

*Primary Examiner* — Nguyen Vo

(57) ABSTRACT

A method of calibrating a polar amplification stage including a main signal path and a magnitude signal path, the method comprising: generating signals (108, 142) for the main signal path and the magnitude signal path for operating an amplifier (102) between a linear mode of operation and a saturated mode of operation; detecting (114) first and second peaks in a signal at the output of the amplifier (102) representing transitions between the linear and saturated modes of operation; and adjusting (124) the timing in one of the main signal path and the amplitude signal path in dependence on a relative difference between the size of the detected first and second peaks.

20 Claims, 7 Drawing Sheets

(51) Int. Cl.
*H03F 3/24* (2006.01)
*H04L 27/36* (2006.01)

(56) References Cited

U.S. PATENT DOCUMENTS

2009/0097591 A1  4/2009  Kim
2009/0202018 A1  8/2009  Reddy et al.
2011/0142177 A1*  6/2011  Kang et al. .................. 375/340

OTHER PUBLICATIONS

"Parent GB Patent Application No. GB1108979.4 Search Report", Sep. 15, 2011, Publisher: GB IPO, Published in: GB.

Officer: Giulio Fedi, "Related International Patent Application No. PCT/EP2012/059935 International Search Report and Written Opinion", Jul. 16, 2012, Publisher: PCT, Published in: EP.

* cited by examiner

Input envelope path (supply control)

Input RF path (input signal)

RF output

TIME ALIGNMENT FOR AN AMPLIFICATION STAGE

BACKGROUND TO THE INVENTION

1. Field of the Invention

The present invention relates to a polar amplification stage which is suitable for, but not limited to, a transmitter. The invention is particularly but not exclusively concerned with an amplification stage in which an envelope tracking (ET) modulator is utilised to provide a power supply to an RF amplifier.

2. Description of the Related Art

Polar amplification stages, also known as polar modulators, are well-known in the art, and comprise an arrangement in which separate magnitude and main signal paths are utilised in order to amplify a signal for transmission. Polar amplification stages are typically used in transmitters, such as transmitters for RF (radio frequency) applications. A mobile communication system RF implementation may use a polar amplification stage.

Known polar amplifiers utilise, for example, envelope tracking (ET) techniques or envelope elimination and restoration (EER) techniques. In an envelope tracking amplification stage a modulated power supply is generated for an amplifier in dependence on the envelope (magnitude) of the input signal to be amplified by the amplifier, and the input signal to be amplified is provided as the input of the amplifier.

It is an objective in such amplification stages to minimise the distortion in the transmitted signal. It is known that one cause of distortion is a result of the total delay suffered by the main signal (in a main signal path) and the total delay suffered by the magnitude signal (in a magnitude signal path) not being equal to each other. In order to meet system specification requirements, it is necessary to align the signal in the main signal path and the magnitude signal path to ensure that any timing misalignment between those signals falls within a permitted range. Any misalignment of the timing signals in the paths results in distortion of the transmitted signal, and can reduce transmitter efficiency.

With reference to FIG. 1 there is illustrated components of an exemplary known RF amplification architecture in which an envelope tracking (ET) modulator is used to provide a power supply to a radio frequency (RF) power amplifier.

As illustrated in FIG. 1, an RF power amplifier 102 receives an RF input signal to be amplified on an input line 136, and receives a modulated power supply voltage $V_{supply}$ on line 138. The RF power amplifier 102 generates an RF output signal on line 140. An example implementation of such an RF power amplifier is in mobile communication systems, with the RF output on line 140 connected to the front end of radio transmission equipment.

A signal generation block 122 receives a baseband signal (not shown) to be amplified by the amplifier 102. The signal generation block generates a signal on line 125a representing the envelope of the input signal to be amplified. The signal generation block 122 additionally generates I and Q components of the input signal to be amplified on lines 125b and 125c.

The generation of the envelope signal and the I and Q components of the baseband input signal is known to one skilled in the art. Various techniques for the generation of such signals may be implemented.

As illustrated in FIG. 1, the envelope signal on line 125a representing the envelope of the input signal to be amplified is converted by a digital-to-analogue converter 126a into an analogue signal, filtered by an optional envelope filter 128a, and then provided as an input to an ET modulator 108. The ET modulator 108 may be implemented using a variety of techniques. For example, the ET modulator 108 may incorporate a switched mode power supply for selecting between one of a plurality of supply voltages in dependence on the magnitude of the envelope signal, and a correction or adjustment stage for adjusting the selected supply voltage in dependence on an error determined between the selected supply voltage and a reference signal based on the envelope signal. An exemplary envelope tracking modulator is described in U.S. Pat. No. 7,482,869. The output of the ET modulator 108 forms an input to an output filter 106, and a modulated supply voltage is then provided through a supply feed 104 to provide the supply voltage on line 138.

The baseband I and Q components of the input signal on lines 125b and 125c are converted into analogue signals via respective digital-to-analogue converters 126b and 126c, and optionally filtered through respective I and Q filters 128b and 128c. The filtered I and Q components of the input signal are provided as inputs to a vector modulator, illustrated as respective multipliers 130a and 130b and a combiner 132. The combined output of the combiner 132 forms an input to a variable gain amplifier 134, the output of which forms an input to an optional inter-stage surface acoustic wave (SAW) filter 112. The output of the filter 112 provides the RF input signal to be amplified on input line 136 to the RF power amplifier 102.

As known in the art, the envelope path which the envelope signal follows from the digital-to-analogue converter 126a to generation of the supply voltage on line 138 to the power amplifier 102 suffers from delays which vary on a unit-by-unit basis within a production tolerance. As also known in the art the input or RF path which the baseband signal follows from the digital-to-analogue converters 126b and 126c to generation of the RF input signal to be amplified on line 136 suffers from delays.

In general, such delays need to be controlled so as to ensure that they fall within certain tolerances, usually smaller than the production tolerances, to ensure maximum operating efficiency of the power amplifier and to ensure certain spectral emissions requirements are met (such as a minimum distortion of the amplified output signal).

In the envelope path delays may be introduced by several stages, such as the filter 128a, the output filter 106, and the supply feed 104. In addition delays may arise in the ET modulator 108 itself.

In the input or RF path delays may also be introduced by several stages, such as the respective I and Q filters 128b and 128c, and in the inter-stage SAW filter 112.

It is an aim of the present invention to provide an improved technique for a polar modulator in which distortion in an amplified signal is reduced by controlling the relative delay between the main signal path and the magnitude signal path.

It is also an aim of the present invention to provide an improved technique for an envelope tracking power supply for an RF amplifier, in which distortion in an amplified signal is reduced by controlling the relative delay between in the RF signal path and the envelope signal path.

SUMMARY OF THE INVENTION

In one aspect the invention provides a method of calibrating a polar amplification stage including a main signal path and a magnitude signal path, the method comprising: generating signals for the main signal path and the magnitude signal path for operating the amplifier between a linear mode of operation and a saturated mode of operation; detecting first and second peaks in a signal at the output of the amplifier representing transitions between the linear and saturated modes of operation; and adjusting the timing in one of the main signal path and the amplitude signal path in dependence on a relative difference between the size of the detected first and second peaks.

The step of operating the amplifier between linear and saturated modes of operation may comprise switching the operating mode of the amplifier from linear or saturated mode to saturation or linear mode respectively, and back.

The step of generating signals for the main signal path and the magnitude signal path may comprise generating an input signal for the input path to the amplifier having rising and falling slopes; and generating an input signal for the envelope path to the amplifier having opposite slopes to the signal in the input path. The input signal in the input path may include a rising slope followed by a falling slope, the first peak in the output signal corresponding to a condition where the amplifier transitions from a linear mode of operation to a saturated mode of operation, and the second peak in the output signal corresponding to a condition where the amplifier transitions from a saturated mode of operation to a linear mode of operation.

If the first peak is determined to be larger than the second peak, the timing of the magnitude signal path may be delayed relative to the timing of the main signal path. If the first peak is determined to be smaller than the second peak, the timing of the main signal path may be delayed relative to the timing of the magnitude signal path.

The input signals may be periodic, and the steps may be repeated for each period.

The steps may be performed for a calibration phase of operation, and the step of adjusting the timing may be applied prior to a normal phase of operation.

In another aspect the invention provides a polar amplification stage including a main signal path to an amplifier input and a magnitude signal path to the amplifier supply, the apparatus further comprising: a signal generator for generating signals for the main signal path and the magnitude signal path arranged to operate the amplifier between a linear mode of operation and a saturated mode of operation; a detector for detecting first and second peaks in a signal at the output of the amplifier representing transitions between the linear and saturated modes of operation; and a delay adjustment block for adjusting the timing in one of the main signal path and the amplitude signal path in dependence on a relative difference between the size of the detected first and second peaks.

The signal generator may be arranged to generate the signals to operate the amplifier between linear and saturated modes of operation by switching the operating mode of the amplifier from linear or saturated mode to saturation or linear mode respectively, and back.

The signal generator may be arranged to generate an input signal for the input path to the amplifier having rising and falling slopes; and generate an input signal for the envelope path to the amplifier having opposite slopes to the signal in the input path.

The signal generator may be arranged to generate the signals such that the input signal in the input path includes a rising slope followed by a falling slope, the first peak in the output signal corresponding to a condition where the amplifier transitions from a linear mode of operation to a saturated mode of operation, and the second peak in the output signal corresponding to a condition where the amplifier transitions from a saturated mode of operation to a linear mode of operation.

The adjustment bock may be arranged such that if the first peak is determined to be larger than the second peak, the timing of the magnitude signal path is delayed relative to the timing of the main signal path.

The adjustment block may be arranged such that if the first peak is determined to be smaller than the second peak, the timing of the main signal path is delayed relative to the timing of the magnitude signal path.

The signal generator may be arranged to generate periodic input signals, and the steps are repeated for each period.

The timing adjustment block may be arranged to apply the timing adjustment prior to a normal phase of operation.

The polar amplification stage may be an envelope tracking modulator, the magnitude signal path comprising an envelope signal path and the main signal path comprising a path of a signal to be amplified.

The amplification stage may be an RF amplification stage.

BRIEF DESCRIPTION OF THE FIGURES

The invention will now be described by way of example with reference to the accompanying Figures in which.

DESCRIPTION OF THE PREFERRED EMBODIMENTS

Figure 1:
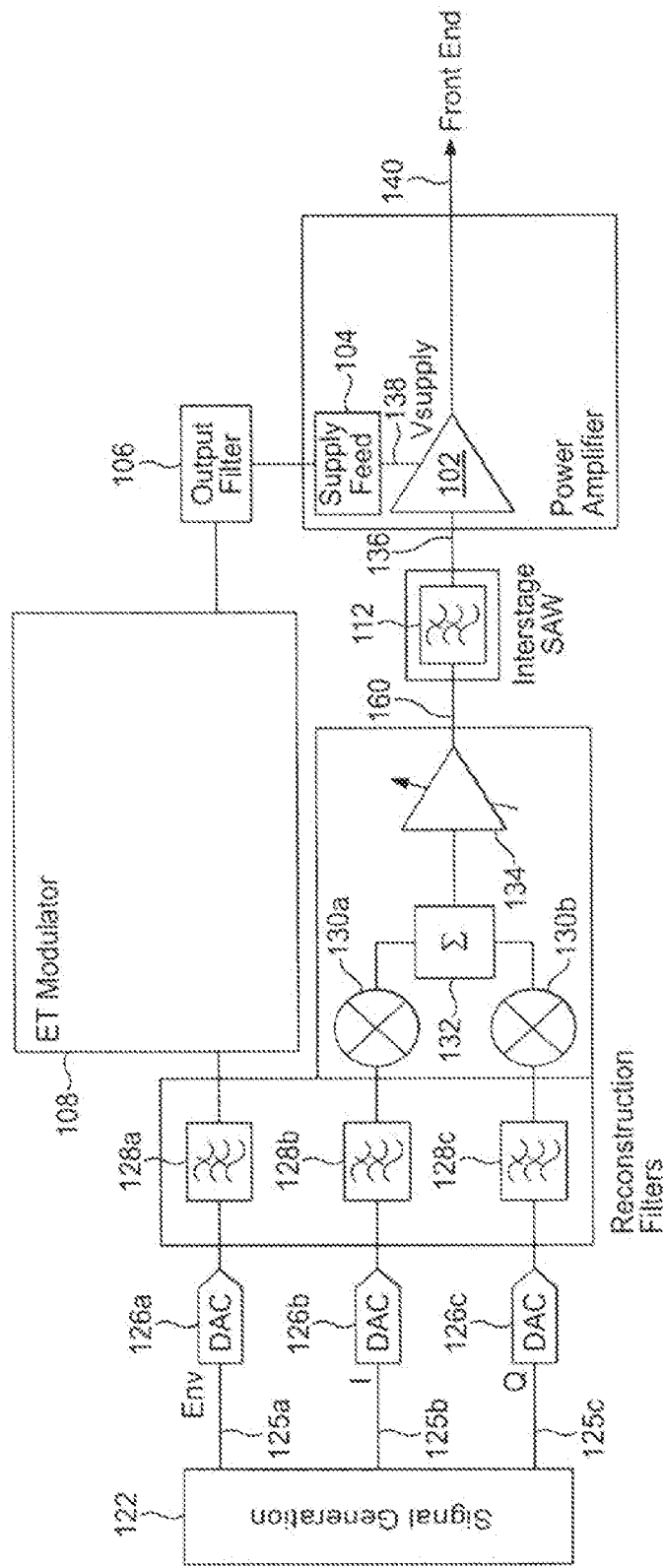
FIG. 1 illustrates an exemplary RF amplification stage incorporating an envelope tracking power supply or modulator, in accordance with the prior art.

The invention is applicable in general to polar amplification stages. In the following description the invention is described with specific reference to the example of an amplification stage incorporating an envelope tracking (ET) polar modulation technique. However this is for the purposes of illustrating an exemplary implementation of the invention, and to aid in understanding the invention, and the invention is not limited to such a specific technique. The skilled person will appreciate the invention may also be implemented in other polar transmitter technologies including, for example, envelope elimination and restoration technologies. One skilled in the art will appreciate that the invention and its embodiments may be utilised in a broader range of polar transmitters than is set forth herein.

In the following description, where an element of one Figure corresponds to an element of another Figure, like reference numerals are used to denote a correspondence. The presentation of a combination of features in an embodiment does not represent a limitation that the combination of features is necessarily essential to an embodiment, nor exclude the possibility that elements of an embodiment may be used without other illustrated elements or with other non-illustrated elements.

The invention will now be described with further reference to the exemplary RF amplification architecture of FIG. 2, which modifies the arrangement of FIG. 1 in accordance with exemplary embodiments of the invention. The invention, and its embodiments, is not however limited in its applicability to the exemplary architecture and implementation as illustrated in FIG. 2.

Figure 2:
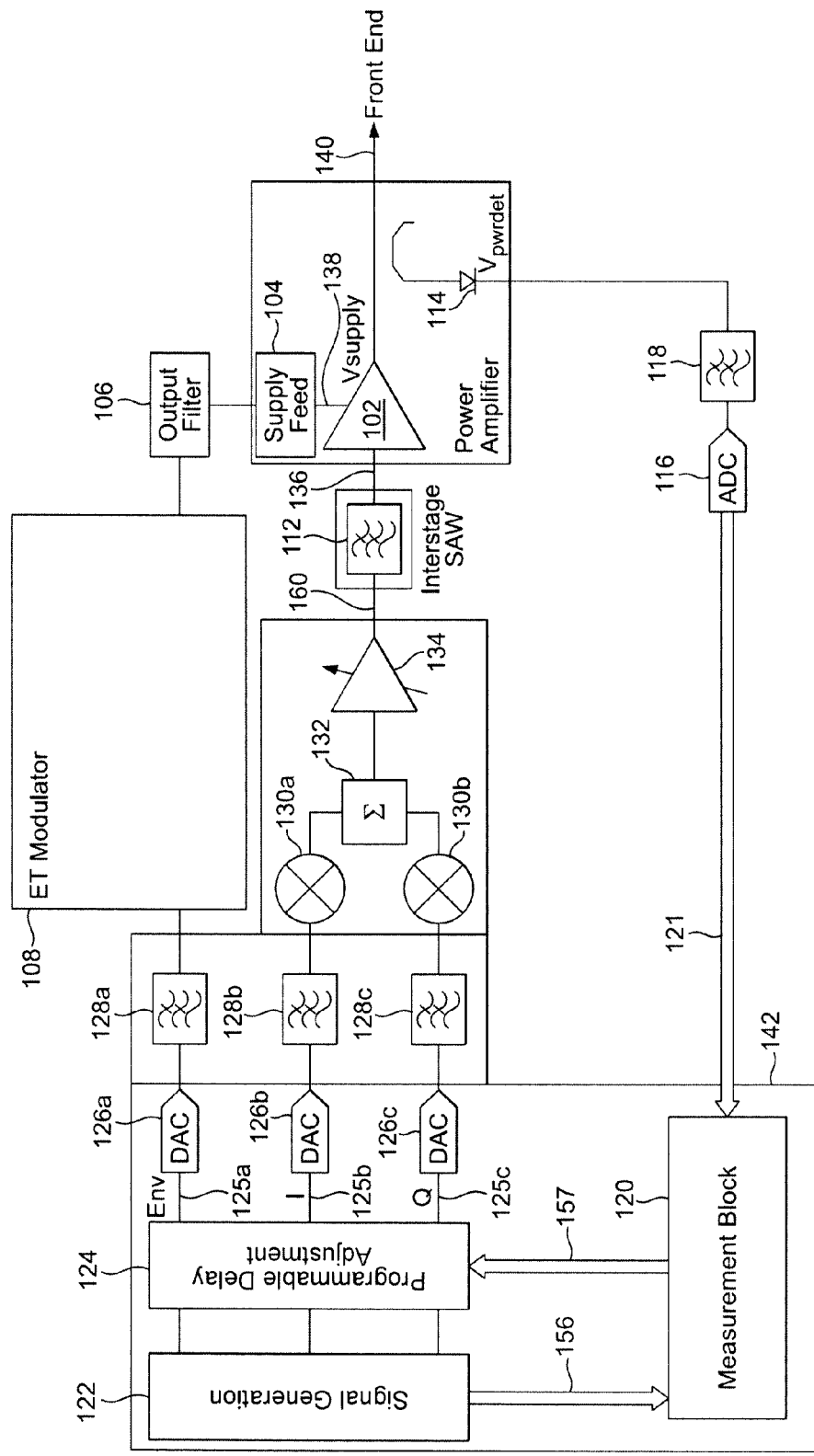
FIG. 2 illustrates a modified exemplary RF amplification stage incorporating an envelope tracking power supply or modulator in accordance with a preferred embodiment of the invention.

With reference to FIG. 2, the RF amplification architecture is adapted to include a calibration control stage 142 including the signal generation block 122, a programmable delay adjustment block 124, and a measurement block 120, in accordance with an exemplary implementation of the present invention.

As illustrated in the embodiment of FIG. 2, the envelope signal, I component of the input signal, and Q component of the signal for the respective digital-to-analogue converters 126a to 126c are generated on lines 125a, 125b and 125c respectively by the signal generation block 122 via the programmable delay adjustment block 124.

The signal generation block 122 optionally generates signals to the measurement and correlation block 120 on lines 156, and the measurement block 120 generates signals to the programmable delay adjustment block 124 on lines 157.

A diode 114 is connected to the output of the power amplifier 102 on line 140 in order to provide the functionality of a power detector. The diode 114 is further connected to a filter 118, which in turn is connected to an analogue-to-digital converter 116 to provide a digital and filtered representation of the signal detected by the diode 114 to the measurement block 120 on line 121.

The implementation shown is exemplary, and the invention is not limited to the use of a diode as a power detector to provide feedback to the measurement block 120. In general, the diode 114 represents a functional block for providing a signal representing the amplitude or power of the signal at the output of the RF power amplifier 102 on line 140. In an alternative implementation, the detection could for example be implemented using a receiver chain including an analogue to digital converter, with detection of the envelope being implemented in the digital domain.

The adaptation of an RF power amplification stage in accordance with the exemplary arrangement of FIG. 2 provides for a calibration system that reduces the delay uncertainty in the envelope path and the RF path, and that can be implemented as a self-calibration.

In accordance with the principles of this invention the power amplifier is driven in and out of compression, such that it operates in both a linear mode of operation (without compression) and a saturated mode of operation (with compression). This is preferably achieved by providing a signal for the RF input path which has an increasing and decreasing slope, whilst at the same time the envelope path is driven with a signal with opposite slopes to that of the signal on the RF input path.

Figure 3:
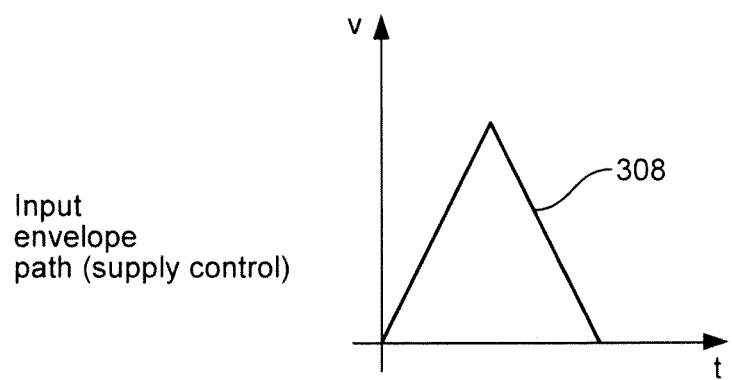
FIGS. 3(a) to 3(c) illustrate waveforms in exemplary arrangements of embodiments of the invention.
Figure 3:
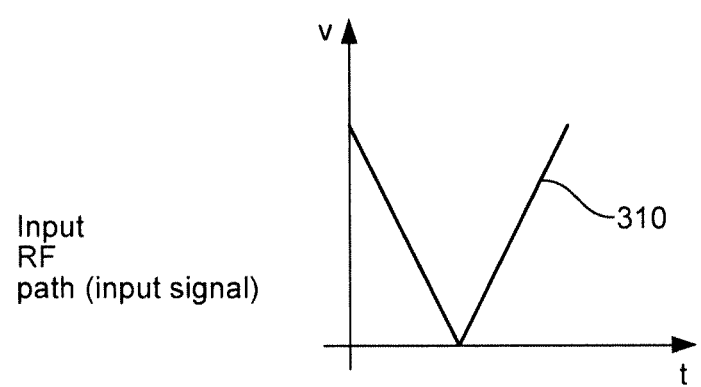
Figure 3:
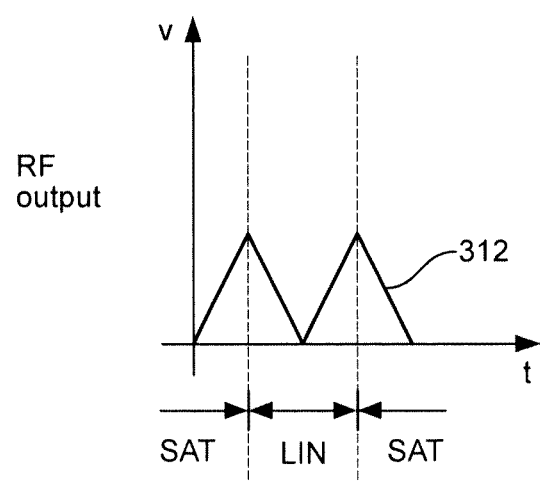

This is illustrated with respect to FIG. 3, which shows a triangular signal in FIGS. 3(a) and 3(b) which may be applied to the input envelope path, and an inverse triangular signal applied to the RF input path as shown in FIG. 3(b). The signal to the input envelope path is denoted by reference numeral 308, and the signal to the RF input path is denoted by reference numeral 310.

As illustrated in FIGS. 3(a) and 3(b), the signals contain two distinct slopes, one increasing and one decreasing, and one signal is the inverse of the other.

As noted above, the levels of the signal applied to the RF input path and the envelope path must be set such that both linear and saturation modes of operation are obtained in the power amplifier. The effect of this is that when the signal in the RF input path is small enough, i.e. lower than the power supply voltage provided to the power amplifier as determined by the signal in the envelope path, the power amplifier operates in a linear mode of operation. In a linear mode of operation, the power amplifier output power is a strong function of the power amplifier input level. When the RF input path signal becomes large enough, i.e. higher than the power supply voltage provided to the power amplifier by the signal in the envelope path, the power amplifier operates in saturation mode and the power amplifier output level becomes a strong function of the signal in the envelope path to the power amplifier supply voltage.

This means that due to the opposite signal slopes on each path, there will be a peak of the power amplifier output voltage at the point when the power amplifier transitions from a linear mode of operation to a saturated (non-linear) mode of operation and a peak where the power amplifier transitions from a saturated (non-linear) mode of operation to a linear mode of operation. This will occur both during the up and down slopes of the input signals, which therefore generate two power amplifier output voltage peaks.

For the simple example of the input signals of FIGS. 3(a) and 3(b), the RF output signal is illustrated in FIG. 3(c), and denoted by reference numeral 312. As can be seen, the RF output signal has two peaks. The first peak represents the transition point from saturated operation to linear operation, and the second point represents the transition from linear operation to saturated operation.

Although in the example of FIGS. 3(a) to 3(c) the input signals are shown as triangular waves, the invention is not limited to the input signals being of any particular shape. The input signals can be, for example, sine waves or any other type of signal. The only characteristic required of the input signals is that they contain two distinct slopes, one increasing and one decreasing, and that the signal in one path is the inverse of the other.

Figure 4:
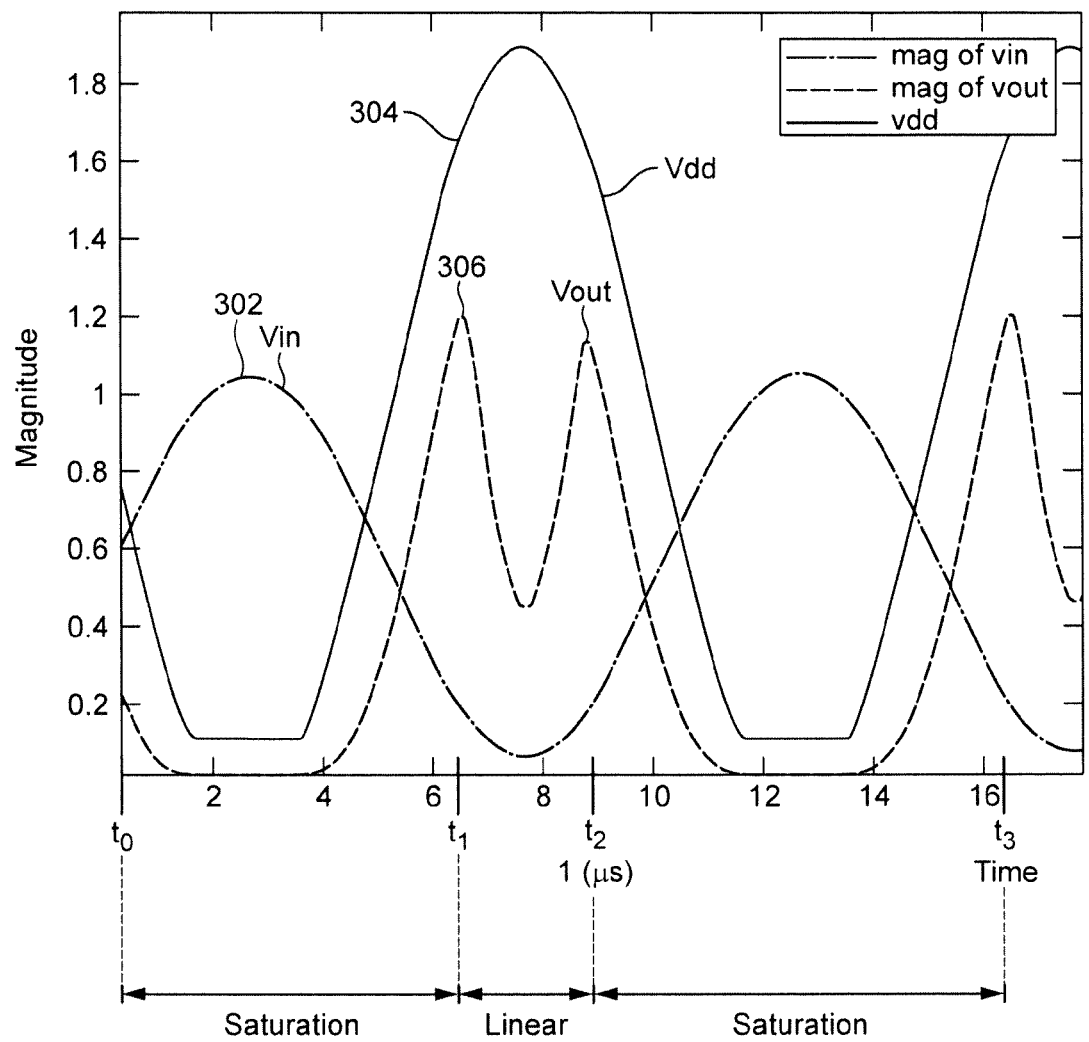
FIG. 4 illustrates exemplary waveforms in an exemplary arrangement of an embodiment of the invention.

With reference to FIG. 4 there is illustrated a further example. In FIG. 4 waveform 302 represents the input voltage on the RF input path, which as illustrated is a sinusoidal signal. Waveform 304 represents the supply voltage provided by the ET modulator. Waveform 306 represents the voltage at the output of the power amplifier.

As illustrated in FIG. 4, between times $t_0$ and $t_1$ the amplifier operates in non-linear or saturated mode, between times $t_1$ and $t_2$ the amplifier operates in linear mode, and between times $t_2$ and $t_3$ the amplifier operates in saturated or non-linear mode. At the time at which the amplifier changes from non-linear to linear mode, at time $t_1$, a peak in the output signal is generated. Similarly at the time that the amplifier transitions from linear to non-linear mode, time $t_2$, a peak in the output signal occurs.

If there is a timing misalignment in either the first or second peak at times $t_1$ and $t_2$ one peak would be larger than the other, due to the transition in power amplifier operating mode occurring at a slightly different operating condition. For example if the envelope path to the power amplifier supply voltage has a signal which is slightly earlier than the signal on the RF input path, then its rising flank will cause the transition into linear mode to occur earlier, and the first peak will be larger than the second peak. Similarly the transition out of linear mode also occurs slightly earlier and therefore non-linear mode will occur earlier and the second peak will be slightly less in amplitude.

Figure 5A:
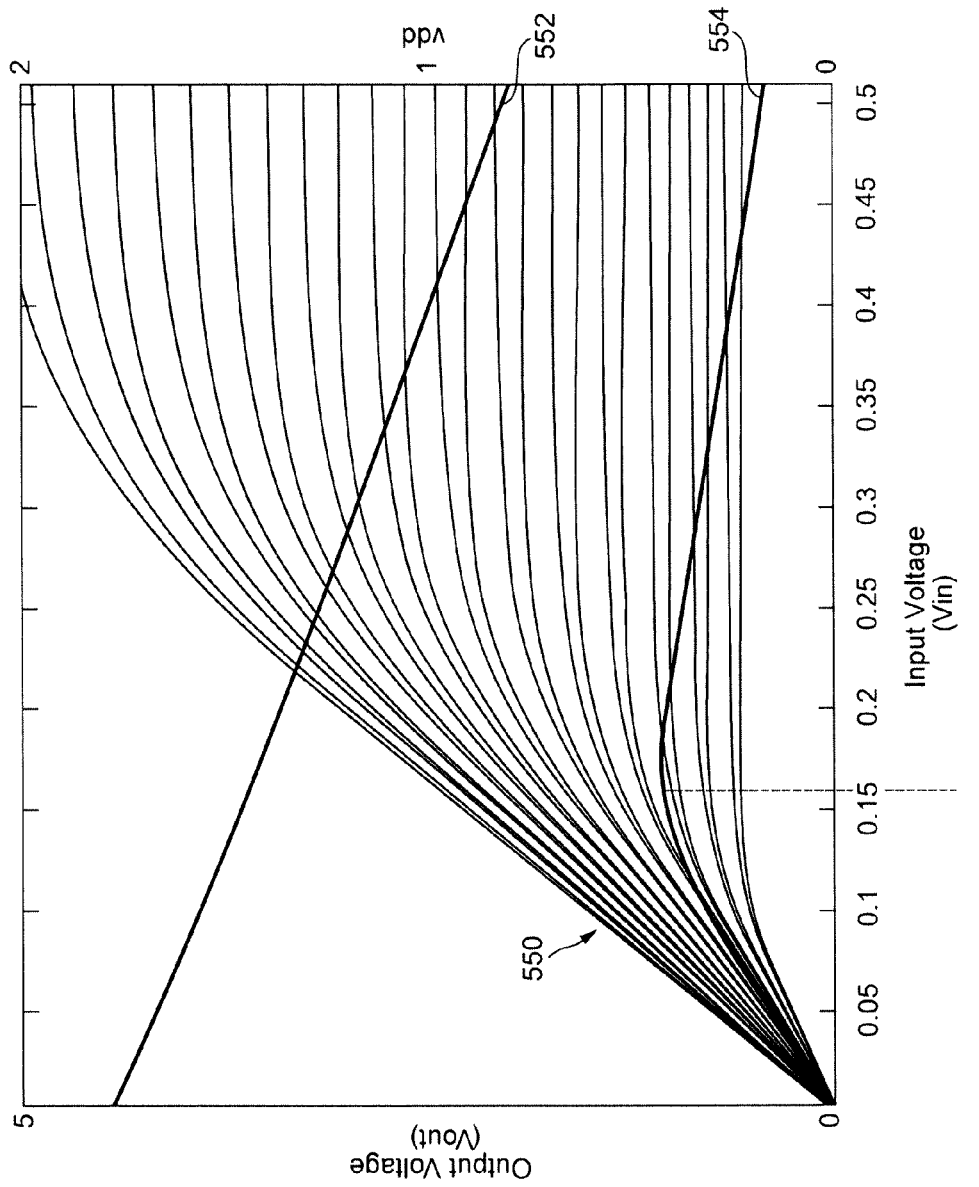
FIG. 5(a) illustrates the principle of operation of the amplifier with a decreasing power supply.
Figure 5B:
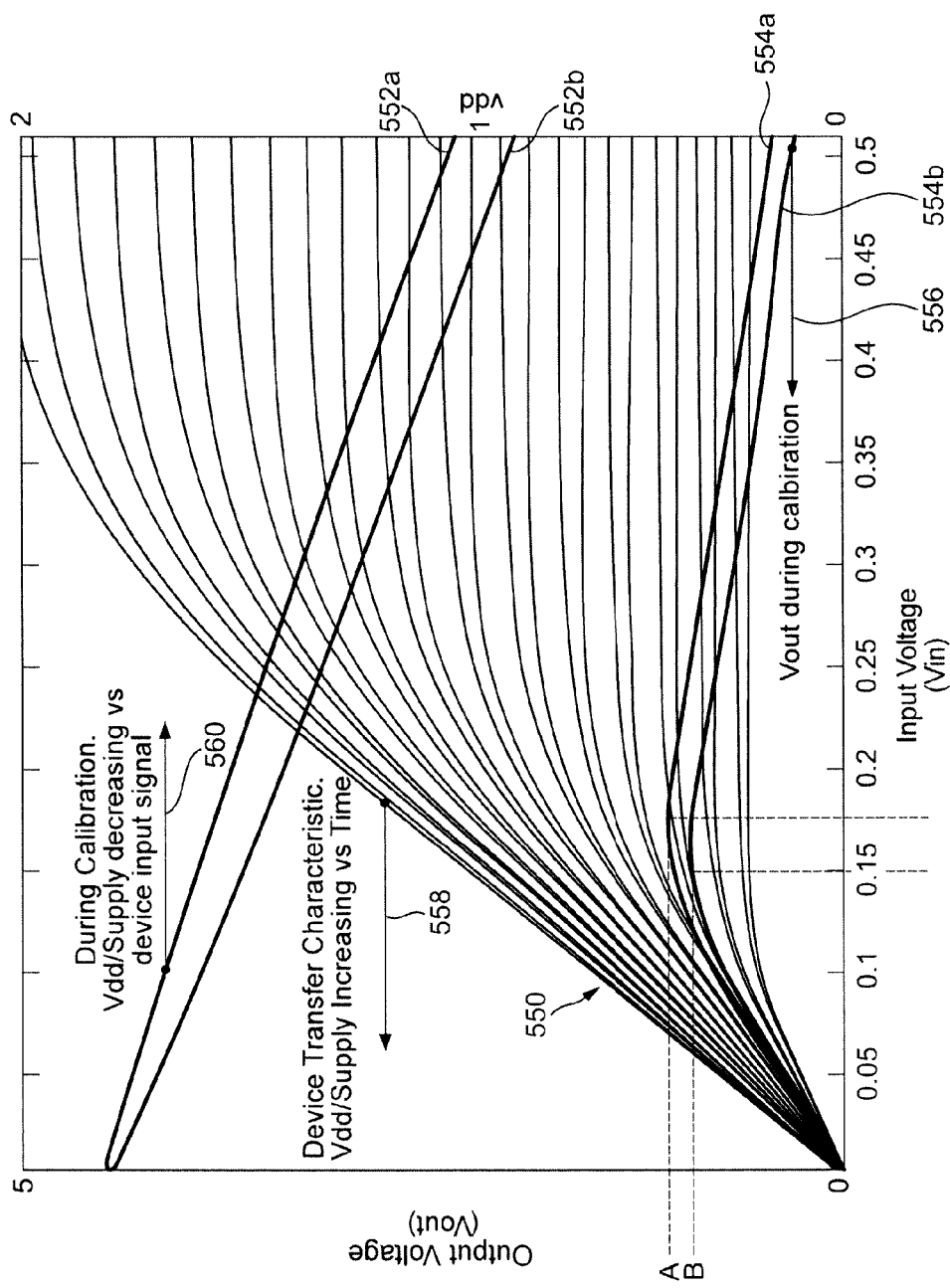
FIG. 5(b) illustrates exemplary waveforms in an exemplary arrangement of an embodiment of the invention.

Reference is made to FIGS. 5(a) and 5(b) to help further understand the occurrence of one peak being larger than the other when a timing misalignment is present.

FIG. 5(a) illustrates as a main plot a typical device transfer characteristic of a transistor of the amplifier stage, comprising numerous plots 550 of amplifier output voltage against amplifier input voltage. The numerous plots 550 reflect the sweeping of the power amplifier supply voltage, such that the higher the output voltage the higher the supply voltage. Such a transfer characteristic as represented by waveforms 550 is well-known in the art.

Also illustrated in FIG. 5(a) is a plot 552 of supply voltage to the amplifier in a calibration mode of operation in accordance with an embodiment of the invention. In the illustration of FIG. 5(a) there is represented a condition, in the calibration mode of operation, where there is no delay between the envelope path signal and the RF input path signal. As shown 552 illustrates a falling supply voltage as the input voltage increases. Further illustrated is a plot 554 of output voltage against the input voltage in association with the falling supply voltage 552.

As illustrated in FIG. 5(a), the output voltage increases in accordance with the normal behaviour of the transistor device characteristics, following the input voltage. However at some point denoted by time $t_a$ the output voltage peaks and starts to fall, as the amplifier has reached saturation due to the decreasing supply voltage 552 in combination with the increasing input voltage. The output voltage the slopes off as the input voltage continues to rise and the supply voltage continues to decrease.

With reference to FIG. 5(b), there is illustrated the effect on the amplitude of the peak of waveform 554 of FIG. 5(a) as a result of relative delays between the envelope signal and the input signal, which results in the differences in peak amplitudes which are detected in the circuit of FIG. 2.

As illustrated by arrow 558, for the device transfer characteristics waveforms 550 the output voltage of the amplifier increases as the input voltage increases, for increasing supply voltages.

As denoted by arrow 560, during a calibration operation in accordance with the invention the slope of the supply voltage relative to the input voltage will vary in dependence on the relative delay in the input signal path and the envelope signal path. As denoted by arrow 560, for a given input voltage the instantaneous supply voltage will vary in dependence on the relative delay.

The supply voltage waveform 552 of FIG. 5(a) is thus replaced by supply voltage waveforms 552a and 552b in FIG. 5(b). FIG. 5(b) represents a timing misalignment with respect to FIG. 5(a).

The output voltage waveform 554 of FIG. 5(a) is also replaced by the output voltage waveforms 554a and 554b. The output voltage waveform 554a is associated with the supply voltage 552a, and the output voltage waveform 554b is associated with the supply voltage 552b. These output voltage waveforms 554a and 554b show the effect of timing misalignment between the envelope and input signal paths on the size of the peaks in the output.

For the supply voltage waveform 552a, the corresponding output voltage waveform is 554a, which peaks at an output voltage level A. For the supply voltage waveform 552b, the corresponding output voltage waveforms is 554b, which peaks at output voltage level B. The voltage peak B is less than voltage peak A. The output voltage 554b is not able to reach as a high a level as the output voltage 554a, because the decreasing supply voltage 552b results in saturation being reached at a lower input voltage than for supply voltage 552a. For supply voltage 552b the amplifier enters saturation for a lower input voltage, and is thus not able to achieve as a high a peak as for supply waveform 554a. In general, the later the supply voltage is in comparison to the input waveform, the higher the associated peak at a transition from linear mode to saturation will be.

In summary, the supply drops down to a certain level and then the amplifier output is dominated by the supply. The supply goes down as the input increases, due to the inverse nature of the signals. If the supply is early, then a low peak is obtained. If the supply is late, then a high peak is obtained.

The peaks also provide information about the direction of delay. If the first peak is larger than the second peak then the signal on the envelope path to the power amplifier supply voltage needs to be delayed, or alternatively the signal on the RF input path needs to be advanced, and if the second peak is larger than the first peak then the signal on the envelope path to the power amplifier voltage supply needs to be advanced (or the signal on the RF input path needs to be delayed).

Figure 6:
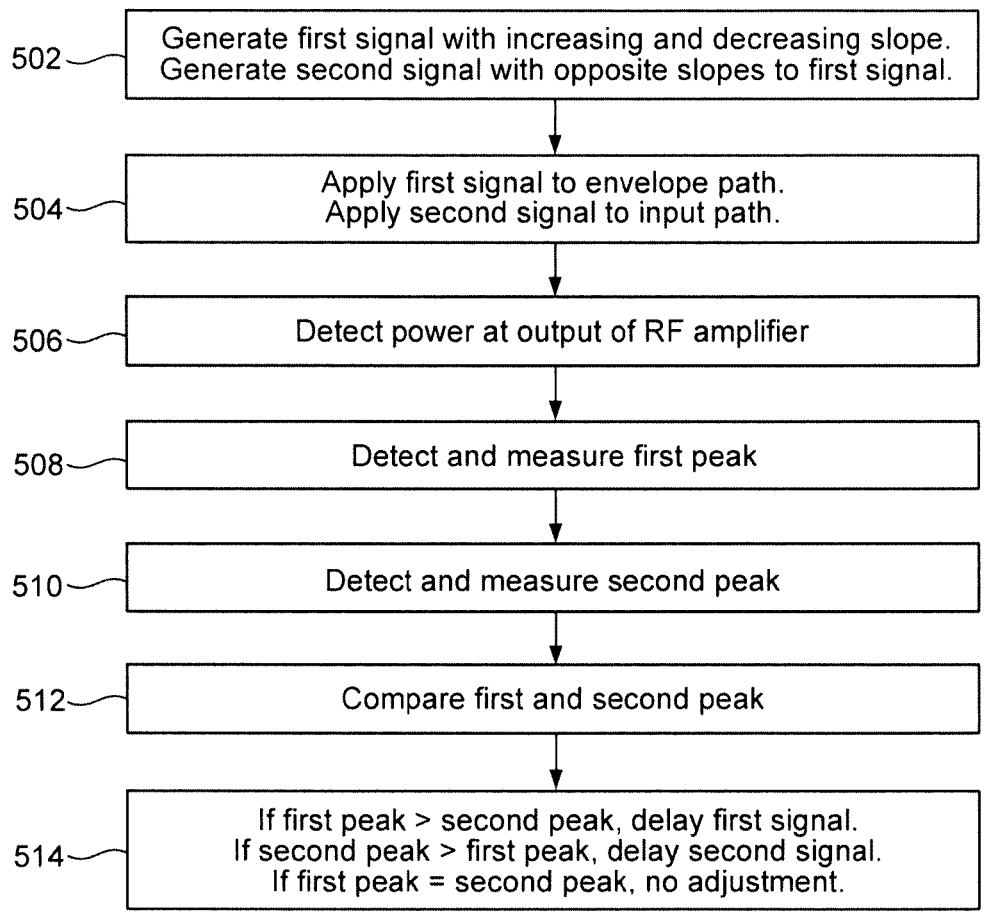
FIG. 6 illustrates the steps in utilising the exemplary RF amplification stage of FIG. 2 in an embodiment of the invention.

The principles of the present invention as exemplified by the arrangement of FIG. 2 are now further described with reference to an exemplary procedure as set out in the flow diagram of FIG. 6.

As denoted in step 502, the signal generation block 122 is arranged to generate first and second signals for the envelope path and the RF input path. One signal is a signal with increasing and decreasing slopes, and the second signal is the inverse of the first signal, with opposite slopes. The first and second signals may be generated independently by the signal generation block 122, or one signal may be generated for one path and then inverted for the other path.

In a step 504 the first and second signals are applied to the envelope path and the input path respectively. It should be noted that there is no requirement for the signals to be applied to a particular one of the paths, it is merely a requirement that the signal applied to the two paths have opposite slopes. In this exemplary arrangement, the first signal is processed by the envelope path and the second signal is processed by the input path.

The diode detector 114, as denoted by step 506, detects the power of the output of the RF amplifier, which is delivered to the measurement block 122 through the feedback path formed by the diode 114, the filter 118, and the analogue-to-digital converter 116.

The measurement block 120 detects and measures a first peak, as denoted by step 508. The measurement block then detects and measures a second peak as denoted by step 510. As indicated in FIG. 2, the measurement block 120 may receive a signal from the signal generation block 122, so that the measurement block 120 can associate detected peaks with a particular pair of input signals generated for the input path and envelope paths. For example, a signal on line 156 may provide a trigger to the measurement block 102 to associate two detected peaks with a single input sequence.

As denoted by step 512, the measurement block then compares the first and second detected peaks. As discussed hereinabove, the measurement block makes a determination as to which of the input and envelope paths contains a signal which is more advanced than the other. In dependence upon determination of one signal being more advanced than the other, then an appropriate delay or adjustment is made as denoted by step 514. In the event of the first peak being detected as greater than the second peak, the first signal is delayed (or the second signal advanced). In determination of the second peak being greater than the first peak, the second signal is delayed (or the first signal advanced). In detection of the first and second peaks being equal, no adjustment is made.

The adjustment is preferably made by the measurement block 120 providing an appropriate adjustment to the programmable delay adjustment block 124 on lines 157 in dependence on the measured difference of the peaks and if appropriate the direction of the measured difference.

The process may then be applied iteratively, until the measurement block 120 determines that the delay between the two paths is determined to fall within an acceptable tolerance.

The measurement timing resolution restrictions of the ADC 116 may be relaxed by post-processing the peak information to interpolate the peaks.

The technique as described for reducing delay between the signals in the RF input path and the envelope path has a number of advantages.

The main advantage of the technique described herein is that the delay is detected based on very large power amplifier output signals. On this basis there is no requirement for a particularly sensitive detection device. The technique is relatively insensitive to quantisation, noise or isolation effects.

A second advantage of the described technique is that the direction of required delay adjustment can be seen from the signal generated at the power amplifier output by comparing the two peaks generated when entering linear mode and exiting linear mode. This means that the detection of the correction direction of delay adjustment is not needed. Detection of the correction direction may take additional time and processing effort, which is not a problem incurred by the present techniques.

Thirdly, it is possible to calculate the amount of delay adjustment required due to the amplitude difference (or ratio, or some other characteristic of signal peak differences). If the delay can be calculated from the peak amplitudes then the requirement for a search algorithm is negated. However, tolerances, timing setup and other real world effects may make it impractical to directly calculate the delay requirement absolutely. Nevertheless the ability to provide some measurement of the delay is provided.

The invention is described herein with reference to particular examples and embodiments, which are useful for understanding the invention and understanding a preferred implementation of the invention. The invention is not, however, limited to the specifics of any given embodiment, nor are the details of any embodiment mutually exclusive. The scope of the invention is defined by the appended claims.

The invention claimed is:

1. A method of calibrating a polar amplification stage including a main signal path and a magnitude signal path, the method comprising:
   generating signals for the main signal path and the magnitude signal path for operating an amplifier between a linear mode of operation and a saturated mode of operation;
   detecting first and second peaks in a signal at an output of the amplifier representing transitions between the linear and saturated modes of operation; and
   adjusting a timing in one of the main signal path and the magnitude signal path in dependence on a relative difference between the size of the detected first and second peaks.

2. The method of claim 1 wherein operating the amplifier between the linear and saturated modes of operation comprises switching the operating mode of the amplifier from the linear or saturated mode to the saturation or linear mode respectively, and back.

3. The method of claim 1 wherein generating the signals for the main signal path and the magnitude signal path comprises:
   generating an input signal for the main signal path to the amplifier having rising and falling slopes; and
   generating an input signal for the magnitude signal path to the amplifier having opposite slopes to the signal in the main signal path.

4. The method of claim 3 wherein the input signal in the main signal path includes a rising slope followed by a falling slope, the first peak in the output signal corresponding to a condition where the amplifier transitions from the linear mode of operation to the saturated mode of operation, and the second peak in the output signal corresponding to a condition where the amplifier transitions from the saturated mode of operation to the linear mode of operation.

5. The method of claim 1 wherein if the first peak is determined to be larger than the second peak, the timing of the magnitude signal path is delayed relative to the timing of the main signal path.

6. The method of claim 1 wherein if the first peak is determined to be smaller than the second peak, the timing of the main signal path is delayed relative to the timing of the magnitude signal path.

7. The method of claim 1 wherein the signals are periodic, and the generating, the detecting, and the adjusting are repeated for each period.

8. The method of claim 1 wherein the generating, the detecting, and the adjusting are performed for a calibration phase of operation and wherein the timing is adjusted prior to a normal phase of operation.

9. The method of claim 1 wherein the polar amplification stage is an envelope tracking modulator, the magnitude signal path comprising an envelope signal path and the main signal path comprising a path of a signal to be amplified.

10. The method of claim 1 wherein the amplification stage is an RF amplification stage.

11. A polar amplification stage including a main signal path to an amplifier input and a magnitude signal path to a supply of an amplifier, the polar amplification stage further comprising:
    a signal generator for generating signals for the main signal path and the magnitude signal path arranged to operate the amplifier between a linear mode of operation and a saturated mode of operation;
    a detector for detecting first and second peaks in a signal at an output of the amplifier representing transitions between the linear and saturated modes of operation; and
    a delay adjustment block for adjusting a timing in one of the main signal path and the magnitude signal path in dependence on a relative difference between the size of the detected first and second peaks.

12. The polar amplification stage of claim 11 wherein the signal generator is arranged to generate the signals to operate the amplifier between the linear and saturated modes of operation by switching the operating mode of the amplifier from the linear or saturated mode to the saturation or linear mode respectively, and back.

13. The polar amplification stage of claim 11 wherein the signal generator is arranged to:
    generate an input signal for the main signal path to the amplifier having rising and falling slopes; and
    generate an input signal for the magnitude signal path to the amplifier having opposite slopes to the signal in the main signal path.

14. The polar amplification stage of claim 13 wherein the signal generator is arranged to generate the signals such that the input signal in the main signal path includes a rising slope followed by a falling slope, the first peak in the output signal corresponding to a condition where the amplifier transitions from the linear mode of operation to the saturated mode of operation, and the second peak in the output signal corresponding to a condition where the amplifier transitions from the saturated mode of operation to the linear mode of operation.

15. The polar amplification stage of claim 11 wherein the adjustment bock is arranged such that if the first peak is determined to be larger than the second peak, the timing of the magnitude signal path is delayed relative to the timing of the main signal path.

16. The polar amplification stage of claim 11 wherein the adjustment block is arranged such that if the first peak is determined to be smaller than the second peak, the timing of the main signal path is delayed relative to the timing of the magnitude signal path.

17. The polar amplification stage of claim 11 wherein the signal generator is arranged to generate periodic input signals.

18. The polar amplification stage of claim 11 wherein the adjustment block is arranged to adjust the timing prior to a normal phase of operation.

19. The polar amplification stage of claim 11 wherein the polar amplification stage is an envelope tracking modulator, the magnitude signal path comprising an envelope signal path and the main signal path comprising a path of a signal to be amplified.

20. The polar amplification stage of claim 11 wherein the amplification stage is an RF amplification stage.

* * * * *